United States Patent
Satoh et al.

(10) Patent No.: US 6,983,129 B2
(45) Date of Patent: Jan. 3, 2006

(54) RADIO FREQUENCY SWITCH AND WIRELESS COMMUNICATION APPARATUS USING THE SAME

(75) Inventors: Yuki Satoh, Osaka (JP); Tsutomu Sakai, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 887 days.

(21) Appl. No.: 09/920,330

(22) Filed: Aug. 2, 2001

(65) Prior Publication Data

US 2002/0025785 A1    Feb. 28, 2002

(30) Foreign Application Priority Data

Aug. 4, 2000 (JP) .............................. 2000-237029

(51) Int. Cl.
*H01P 1/10* (2006.01)
*H04B 1/44* (2006.01)

(52) U.S. Cl. ..................... 455/82; 333/103; 333/262; 455/83

(58) Field of Classification Search ............... 333/103, 333/104, 262; 455/73, 78, 79, 80, 81, 82, 455/83

See application file for complete search history.

(56) References Cited

U.S. PATENT DOCUMENTS

| | | | | |
|---|---|---|---|---|
| 3,800,222 A | * | 3/1974 | Kowalewski | 455/83 |
| 4,637,065 A | * | 1/1987 | Ruppel | 455/78 |
| 5,220,679 A | * | 6/1993 | Zametzer et al. | 455/78 |
| 5,257,411 A | * | 10/1993 | Minasi | 455/80 |
| 5,584,053 A | * | 12/1996 | Kommrusch et al. | 455/82 |
| 5,748,053 A | * | 5/1998 | Kameyama et al. | 333/103 |
| 5,777,530 A | * | 7/1998 | Nakatuka | 333/104 |
| 5,789,995 A | * | 8/1998 | Minasi | 333/103 |
| 5,878,331 A | * | 3/1999 | Yamamoto et al. | 455/83 |
| 5,911,116 A | * | 6/1999 | Nosswitz | 455/83 |
| 6,118,985 A | * | 9/2000 | Kawakyu et al. | 455/78 |
| 6,448,868 B2 | * | 9/2002 | Kato et al. | 333/103 |
| 6,731,184 B1 | * | 5/2004 | Muto et al. | 333/103 |

* cited by examiner

Primary Examiner—Harry S. Hong
(74) Attorney, Agent, or Firm—McDermott Will & Emery LLP

(57) ABSTRACT

A first diode is connected in series to a transmission port, and a low pass filter having transmission band and reception band as passing band is disposed between the first diode and an antenna port. A second diode is connected between the reception port and the ground. A phase shifting function is provided between the first diode and a reception port, having reception band as passing band, so that the impedance as seen from the first diode to the reception port side is almost open in the transmission band when a current flows in the second diode.

9 Claims, 2 Drawing Sheets

RADIO FREQUENCY SWITCH AND WIRELESS COMMUNICATION APPARATUS USING THE SAME

BACKGROUND OF THE INVENTION

1. Field of the Invention

The present invention relates to a radio frequency switch usable in an antenna for transmission and reception switching in a wireless communication apparatus, and a wireless communication apparatus using the same.

2. Description of the Related Art

In a system for transmitting and receiving in time division, generally, the antenna is composed by using a switch. Examples of system of communication by time division include PHS (Personal Handyphone System) of Japan and key-less entry system of an automobile.

A conventional circuit configuration of an antenna using a switch is shown in FIG. 2. As shown in FIG. 2, the conventional circuit comprises transmission terminal 101, an antenna terminal 102, a reception terminal 103, a control terminal 104, a transmission power amplifier 105, capacitors 106 to 108, an inductor 109, a current control resistance 110, a bypass capacitor 111, a choke coil 112 for cutting off radio frequency, diodes 113, 115, a quarter wavelength transmission line 114 at transmission frequency, a band pass filter 116 such as SAW filter, a low noise amplifier (LNA) 117 for amplifying reception signal, and a mixer 118 for converting frequency to intermediate frequency.

In this configuration, the capacitors 106 to 108 and inductor 109 compose a low pass filter. In particular, a parallel circuit of the capacitor 108 and inductor 109 resonates at a frequency of about 2 times of the transmission frequency, and removes the harmonic components of the output signal of the power amplifier 105. Further, when a current flows from the control terminal 104 into the diodes 113, 115 and quarter wavelength transmission line 114, the antenna terminal 102 and transmission terminal 101 are connected, and when the current is cut off, the antenna terminal 102 and reception terminal 103 are connected.

The band pass filter 116 removes the undesired signal outside of the band, and prevents occurrence of distortion in the LNA 117. The band pass filter 116 also removes image frequency component which becomes noise in the intermediate frequency component generated in the mixer 118. For the convenience of image removing characteristic, the SAW filter is often used.

In this configuration, however, especially when receiving, the reception sensitivity deteriorates due to insertion loss of the quarter wavelength transmission line 114 and band pass filter 116. When using the quarter wavelength transmission line 114 and SAW filter, the insertion loss of the band pass filter 116 is respectively about 0.5 dB and 3.5 dB, and the total loss may reach as high as about 4.0 dB.

Therefore, in order to enhance the sensitivity further, it is required to decrease the insertion loss in the reception route from the antenna before input to the LNA, in particular.

SUMMARY OF THE INVENTION

The invention is devised in the light of the prior art.

The radio frequency switch of the invention comprises (1) a first diode connected between a transmission terminal and an antenna terminal, (2) a low pass filter connected between the first diode and antenna terminal, and the low pass filter and first diode are disposed in series, (3) a high pass filter connected between the low pass filter side of the first diode and a reception terminal, and (4) a second diode having one end grounded and other end connected between the reception terminal and high pass filter.

DESCRIPTION OF THE PREFERRED EMBODIMENTS

Figure 1:
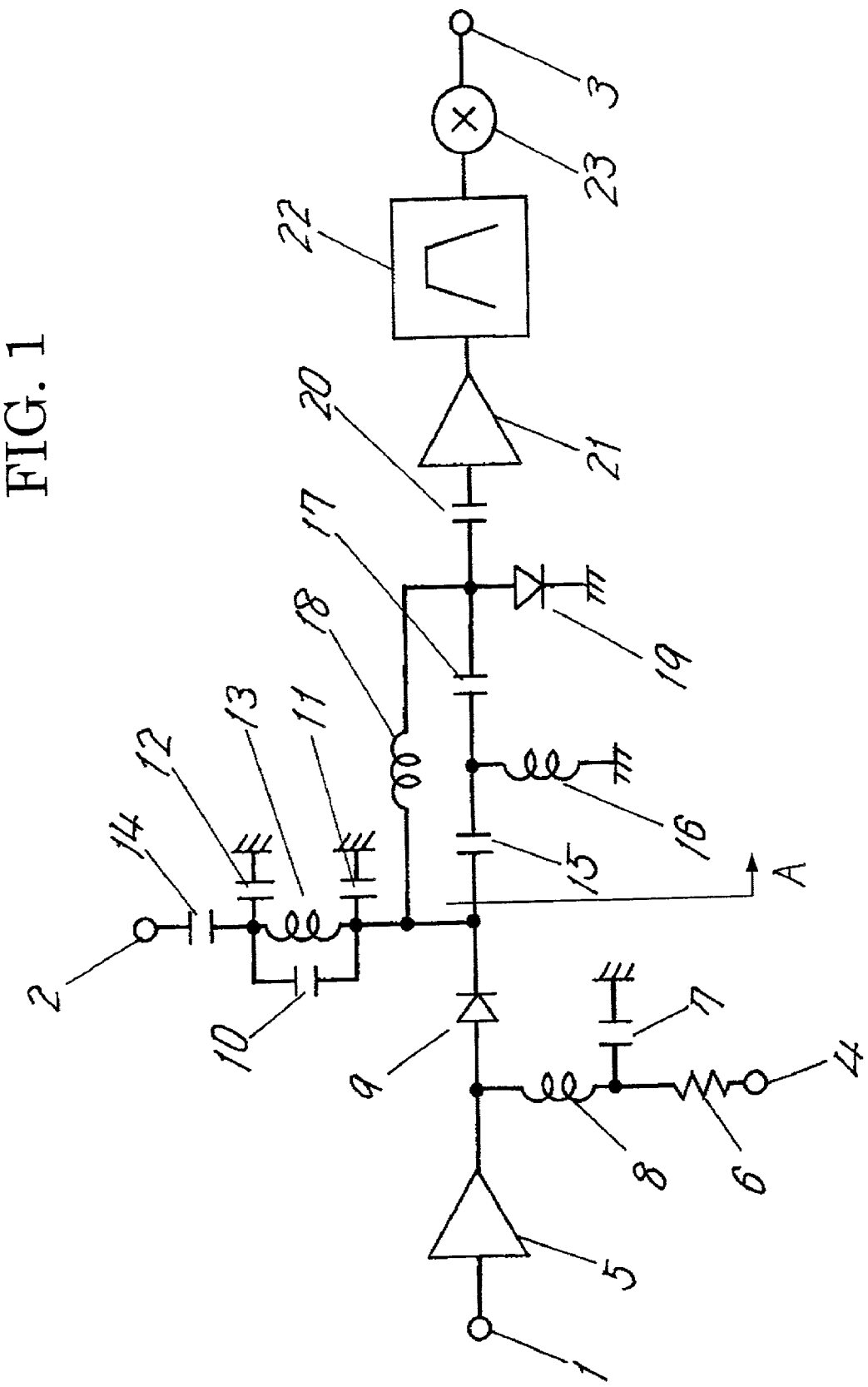
FIG. 1 shows a circuit configuration in an embodiment of the invention.
Figure 2:
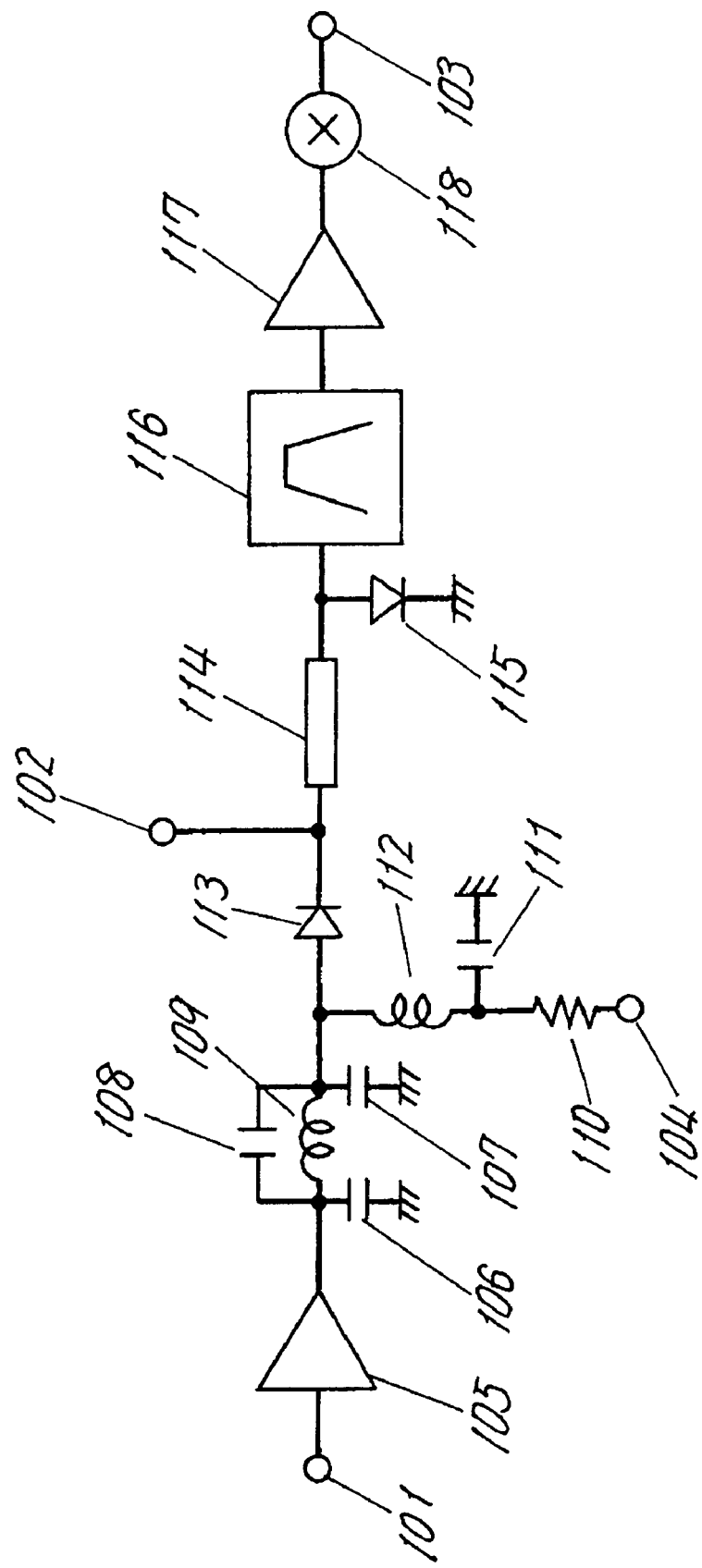
FIG. 2 shows a circuit configuration in a prior art.

Referring now to the drawing, an embodiment of the invention is described below.

FIG. 1 shows a radio frequency switch in an embodiment of the invention.

When a positive voltage is applied to a control terminal 4, diodes 9 and 19 are turned on, and a current flows in a control resistance 6, diode 9, inductor 18, and diode 19. This current value is limited by the resistance 6. The high frequency impedance of the inductor 18 is a sufficiently large value. For example, at 900 MHz, the inductance is about 100 nH. A T-type circuit composed of capacitors 15, 17 and inductor 16 is matched with the system impedance (usually 50 ohms), and a phase shifting circuit of HPF (high pass filter) type is formed. When grounded through the diode 19, the phase shifting circuit advances the phase of the transmission signal by about 90 degrees. In order that the impedance as seen from A to right side may be nearly in an open in the ON state of the diode 19, each values of the inductor 16 and capacitors 15 and 16 are determined.

Therefore, when the diodes 9 and 19 are in ON state, the transmission terminal 1 and antenna terminal 2 are connected, and when the diode is OFF, the antenna terminal 2 and reception terminal 3 are connected. That is, they function as radio frequency switch circuit. Capacitors 14 and 20 are DC cut-off elements. The capacitor 7 is a bypass capacitor and the inductor 8 is a choke coil.

Further, the capacitors 10, 11, 12 and inductor 13 compose a notched π-type LPF (low pass filter). The notch characteristic is realized by the parallel circuit of inductor 13 and capacitor 10. In the wireless communication system, in particular, the harmonic distortion of 2 times of transmission frequency is a serious problem, and hence the frequency of the notch is set at 2 times of the transmission frequency. As a result, the harmonic distortion of 2 times is removed from the output signal of the transmission amplifier 5.

In this configuration, the transmission signal entered in the transmission terminal 1 is efficiently filtered by the notched LPF composed of capacitors 10, 11, 12 and inductor 13 to be deprived of undesired signal components, and is sent into the antenna terminal. On the other hand, in the path from the antenna terminal 2 to the reception terminal 3, a BPF is equivalently formed by the notched LPF composed of the capacitors 10, 11, 12 and inductor 13 and the HPF composed of capacitors 15, 17 and inductor 16.

Usually, when an undesired large signal is fed from the antenna directly into the LNA (low noise filter) 21, the LNA 21 is distorted, and stable communication cannot be maintained. Therefore, generally, a BPF is inserted between the antenna and the LNA 21. In the configuration of the invention, the BPF necessary in the preceding stage of the LNA 21 is composed by combining the LPF for removing higher harmonics for transmission and the HPF composed of a phase shifting circuit. In this configuration, the loss is lowered (the reception sensitivity is enhanced), and the small size and low cost are realized at the same time.

Removal of image frequency component which matters in the mixer 23 is enabled by the SAW filter 22 connected in the later stage of the LNA 21. Further, by connecting an inductor newly parallel to the capacitor 15 or 17, or by connecting a capacitor newly in series to the inductor 16, a notched HPF may be composed, so that the image frequency may be removed more widely by its notch characteristic.

In the embodiment, instead of the SAW filter 22, for example, a filter using a dielectric or an LC filter may be employed.

The capacitors and inductors shown in the embodiment may be composed by using chip components, and therefore if properties are not uniform in manufacture, elements can be replaced individually, and this circuit can be composed as a module mounted on a substrate.

Moreover, the circuit elements (capacitors and inductors) shown in the embodiment may be formed as a pattern composed in a dielectric substrate. In this constitution, for example, by using a low temperature co-fired ceramics (LTCC) substrate, the circuit can be integrated in the laminate structure, and further by using silver or copper of small conductor loss in the inner layer electrode material, a radio frequency switch of smaller size, lower height and smaller loss is realized.

Thus, according to the invention, harmonic components of the output amplifier causing problems particularly at the transmission side can be removed, and the undesired signals outside of the reception band can be removed efficiently while decreasing the loss in the reception side route, and therefore a radio frequency switch realizing an excellent wireless characteristic is obtained.

What is claimed is:

1. A radio frequency switch comprising:
   a first diode connected between a transmission terminal and an antenna terminal;
   a low pass filter connected between said first diode and said antenna terminal, said low pass filter and said first diode being disposed in series;
   a high pass filter connected between said low pass filter side of said first diode and a reception terminal; and
   a second diode having one end grounded and other end connected between said reception terminal and said high pass filter.

2. The radio frequency switch of claim 1,
   wherein said high pass filter shifts a phase of a transmission signal by 90 degrees when said second diode conducts.

3. The radio frequency switch of claim 1,
   wherein said low pass filter includes an inductor and a capacitor, each said inductor and said capacitor being discrete chip component.

4. The radio frequency switch of claim 1,
   wherein said low pass filter and said high pass filter are composed of an inductor and a capacitor formed in a dielectric substrate.

5. The radio frequency switch of claim 1,
   wherein said low pass filter has a attenuation pole at frequency of about 2 times of pass-band frequency in transmission characteristic.

6. The radio frequency switch of claim 1, further comprising:
   an inductor connected parallel to said high pass filter for direct-current coupling of said first diode and said second diode.

7. The radio frequency switch of claim 1,
   wherein said high pass filter is composed of a first capacitor, a second capacitor connected in series to said first capacitor, and an inductor having one end grounded and other end connected to the connection point of said first capacitor and said second capacitor.

8. The radio frequency switch of claim 1,
   wherein said high pass filter has a attenuation pole in transmission characteristic.

9. A wireless communication apparatus comprising:
   a first diode connected between a transmission terminal and an antenna terminal;
   a low pass filter connected between said first diode and said antenna terminal, said low pass filter and said first diode being disposed in series;
   a high pass filter connected between the low pass filter side of the first diode and a reception terminal; and
   a second diode having one end grounded and other end connected between said reception terminal and said high pass filter.

* * * * *